United States Patent
Feudel et al.

(10) Patent No.: US 7,208,397 B2
(45) Date of Patent: Apr. 24, 2007

(54) TRANSISTOR HAVING AN ASYMMETRIC SOURCE/DRAIN AND HALO IMPLANTATION REGION AND A METHOD OF FORMING THE SAME

(75) Inventors: Thomas Feudel, Radebeul (DE); Manfred Horstmann, Duerrroehrsdorf-Dittersbach (DE); Markus Lenski, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 37 days.

(21) Appl. No.: 11/122,740

(22) Filed: May 5, 2005

(65) Prior Publication Data

US 2006/0043430 A1 Mar. 2, 2006

(30) Foreign Application Priority Data

Aug. 31, 2004 (DE) .................... 10 2004 042 156

(51) Int. Cl.
*H01L 21/425* (2006.01)
*H01L 21/22* (2006.01)

(52) U.S. Cl. ...................... 438/525; 438/549

(58) Field of Classification Search ........ 257/548–550, 257/610–612; 438/525, 531, 546, 549
See application file for complete search history.

(56) References Cited

U.S. PATENT DOCUMENTS

| 5,500,379 | A | * | 3/1996 | Odake et al. | ............ 438/217 |
| 6,255,174 | B1 | | 7/2001 | Yu | ............ 438/286 |
| 6,593,623 | B1 | * | 7/2003 | Sultan | ............ 257/344 |
| 6,833,307 | B1 | * | 12/2004 | Wristers et al. | ............ 438/302 |
| 2004/0087094 | A1 | * | 5/2004 | Wristers et al. | ............ 438/302 |

FOREIGN PATENT DOCUMENTS

DE 102 61 307 A1 7/2004
WO WO 2004/040655 A2 5/2004

* cited by examiner

*Primary Examiner*—Calvin Lee
(74) *Attorney, Agent, or Firm*—Williams, Morgan & Amerson, P.C.

(57) ABSTRACT

By providing an asymmetric design of a halo region and extension regions of a field effect transistor, the transistor performance may significantly be enhanced for a given basic transistor architecture. In particular, a large overlap area may be created at the source side with a steep concentration gradient of the PN junction due to the provision of the halo region, whereas the drain overlap may be significantly reduced or may even completely be avoided, wherein a moderately reduced concentration gradient may further enhance the transistor performance.

19 Claims, 5 Drawing Sheets

TRANSISTOR HAVING AN ASYMMETRIC SOURCE/DRAIN AND HALO IMPLANTATION REGION AND A METHOD OF FORMING THE SAME

BACKGROUND OF THE INVENTION

1. Field of the Invention

The present invention generally relates to the fabrication of integrated circuits, and, more particularly, to the design of individual field effect transistor elements to enhance the performance thereof.

2. Description of the Related Art

Integrated circuits typically include a large number of individual circuit elements, such as transistors, capacitors, resistors and the like. These individual circuit elements are electrically connected according to the desired circuit layout by respective conductive lines, which are mainly formed in separate "wiring" layers that are typically referred to as metallization layers. For enhancing the performance of the integrated circuit, usually the number of individual circuit elements is increased, thereby obtaining a more complex functionality of the circuit, and associated therewith the feature sizes of the individual circuit elements are reduced. Generally, a plurality of process technologies are currently practiced, wherein, for logic circuitry, such as microprocessors, storage chips and the like, CMOS technology is presently the most promising approach due to the superior characteristics in view of operating speed, manufacturing costs and/or power consumption. During the fabrication of complex integrated circuits using CMOS technology, millions of complementary transistors, i.e., N-channel transistors and P-channel transistors, are formed in and on an appropriate crystalline semiconductor material, wherein currently the vast majority of logic circuitry is fabricated on the basis of silicon. Typically, a MOS transistor, irrespective of whether an N-channel transistor or a P-channel transistor is considered, comprises so-called PN junctions that are formed at an interface of highly doped drain and source regions with a channel region disposed between the drain region and the source region, wherein the channel region is at least partially inversely doped with respect to the drain and source regions.

The conductivity of the channel region, which represents an essential device criterion as the reduced current drive capability of scaled devices has to be compensated, at least partially, by an increased conductivity, is controlled by a gate electrode formed above the channel region and separated therefrom by a thin insulating layer. The conductivity of the channel region depends on the dopant concentration, the mobility of the charge carriers and, for a given dimension of the channel region in the transistor width direction, the distance between the source and drain regions, which is also referred to as channel length. In addition to the conductivity, the transistor performance is also significantly influenced by its capability of rapidly creating a conductive channel in the channel region upon application of a specified control voltage to the gate electrode, since usually the transistors are operated in a switched mode requiring a fast transition from the transistor on-state to the transistor off-state and vice versa. Moreover, other aspects also have to be taken into consideration when designing a transistor of high performance circuit. For instance, static and dynamic leakage currents may significantly affect the overall performance of an integrated circuit, as the achievable amount of heat dissipation that is required for transistor architectures producing high dynamic and/or static leakage currents, may restrict the maximum practical operating frequency.

With reference to FIG. 1, a typical transistor architecture of a field effect transistor element will now be described in more detail in order to more clearly explain some of the problems encountered in currently used transistor designs. In FIG. 1, a transistor element 100 comprises a substrate 101, which may represent a bulk semiconductor substrate such as a silicon substrate, or any other appropriate substrate having formed thereon a crystalline semi-conductor layer, which may typically be formed on the basis of silicon for logic circuitry. Thus, the substrate 101 is to be considered as a substrate having formed thereon a substantially crystalline semiconductor region 102, in which are formed a drain region 104 including a so-called extension region 104e. Similarly, a source region 103 is formed in the crystalline region 102 and includes an extension region 103e. The area disposed between the extension regions 103e and 104e is referred to as a channel region 105, since here typically a conductive channel is created during the on-state of the transistor 100, as will described later.

Located above the channel region 105 is a gate electrode structure 106 that includes a gate electrode 107 and sidewall spacers 108. Moreover, a gate insulation layer 109 is provided between the gate electrode 107 and the semiconductor region 102 to electrically insulate the gate electrode 107 from any conductive regions within the crystalline semiconductor region 102. Regarding the design and material composition of the gate electrode structure 106, it is to be noted that in principle the gate electrode 107 may be considered as a conductive line, the "width" dimension of which is referred to as a gate length 107a, whereas the "length" of the line, extending in a direction perpendicular to the drawing plane, is referred to as the gate width (not shown in FIG. 1). The gate electrode 107 may be comprised of any appropriate material and is typically formed in advanced silicon-based integrated circuits of heavily doped polysilicon in combination with a highly conductive metal silicide, such as nickel silicide, cobalt silicide and the like. However, depending on the process strategy and the design criteria, other materials such as metals may be used. Frequently, the gate electrode structure 106 comprises the sidewall spacers 108 which may, depending on process strategies, include one or more individual spacer elements and liners, wherein for convenience merely one liner 108a, for instance comprised of silicon dioxide, and one spacer 108, for instance comprised of silicon nitride, is shown.

The gate insulation layer 109 may be comprised of any appropriate insulating material, such as silicon dioxide, silicon nitride and/or high-k materials, to provide a required electrical insulation while maintaining a high capacitive coupling to the channel region 105. Hence, for well approved silicon dioxide based gate insulation layers, a thickness of the gate insulation layer 109 is on the order of a few nanometers, for example 2 nm and less, thereby causing moderately high static leakage currents, which may amount to approximately 30% or even more of the overall electrical losses of advanced transistor elements. Other transistor characteristics, such as switching losses and the like, will be explained later when a typical process flow for forming the transistor 100 is discussed.

During the manufacturing process, the substrate 101 is treated to form the semiconductor region 102 with high crystalline quality which may be achieved by epitaxial growth and the like. Thereafter, photolithography, etch and deposition processes may be performed to define the dimensions of the semiconductor region 102 by providing appropriate isolation structures (not shown). Thereafter, implantation sequences may be carried out to position one or more dopants within the crystalline semiconductor region 102 to thereby form a specified vertical dopant profile (not shown) within the region 102, which may finally result in a specified vertical dopant profile in the channel region 105.

Next, material layers for the gate insulation layer 109 and the gate electrode 107 may be formed, for instance by advanced oxidation and/or deposition techniques for the gate insulation material and by advanced low pressure chemical vapor deposition (CVD) for a polycrystalline silicon layer as a gate electrode material. Thereafter, highly sophisticated photolithography and trim etch techniques may be employed to pattern the gate electrode material and the gate insulation layer material to form the gate electrode 107 and the gate insulation layer 109 on the basis of the design gate length 107a.

Thereafter, complex implantation cycles may be performed to create the drain and source regions 103, 104 and the corresponding extensions 103e, 104e wherein the gate electrode 107 partially in combination with the sidewall spacers 108 acts as an implantation mask. For example, according to one strategy, a so-called pre-amorphization implantation may be carried out, during which a heavy ion species, such as xenon ions and the like, may be implanted into the crystalline semiconductor region 102 to substantially completely destroy the crystalline lattice to a specified depth, which may help in reducing any channeling effects during subsequent implantation processes. During the pre-amorphization implantation, the ion beam may be tilted with respect to a direction 110 perpendicular to the substrate 101 to also amorphize an area of the region 102 corresponding to the extension regions 103e, 104e.

Thereafter, a so-called halo implantation may be performed in which an ion species is introduced that represents the same conductivity type as is already present in the channel region 105 to enhance the dopant concentration of this ion species within specific halo regions, which are indicated as 111. Similarly to the pre-amorphization implantation, the halo implantation may be performed with respective tilt angles, such as $\alpha$ and $-\alpha$, to form the halo regions 111 at the drain side and the source side. Subsequently, a further implantation may be performed with an ion species having the opposite conductivity type with respect to the halo implantation to form the source extension 103e and the drain extension 104e, wherein possibly an additional offset spacer (not shown) may be formed on sidewalls of the gate electrode 107 prior to the implantation. Thereafter, the sidewall spacer 108 may be formed and may be used in a subsequent implantation process as an implantation mask to form the deep and heavily doped drain and source regions 104, 103.

Thereafter, the transistor element 100 may be annealed to activate the dopant introduced by the preceding implantation sequences, i.e., to initiate a diffusion to place the dopants at lattice sites while substantially re-crystallizing those portions of the region 102 that were damaged by the pre-amorphization and the subsequent implantation processes. During this anneal cycle, thermally induced diffusion of the dopants occurs in accordance with the respective concentration gradient of the dopant species under consideration, thereby substantially determining the finally obtained size and characteristics of the drain and source regions 104, 103 and the corresponding extension regions 104e, 103e, as well as the characteristics of PN junctions 103p and 104p defined as an interface area between the halo implantation region 111 and the respective drain or source region 104, 103.

During the implantation cycles and/or during the subsequent anneal cycle, a certain amount of overlap, referred to as overlap regions 103o and 104o, is created, which also significantly affects the transistor behavior. Thereafter, the manufacturing process may be continued with the formation of metal silicide regions in the drain and source regions 104, 103 and in the gate electrode 107 followed by the formation of an interlayer dielectric and respective contacts to the drain and source regions 104, 103 and the gate electrode 107. For convenience, these components are not shown in FIG. 1.

During operation, typically a supply voltage is applied to the drain region 104 and the source region 103, for example 2–5 volts for typical CPUs, while a corresponding control voltage is applied to the gate electrode 107 to define the status of the channel region 105. For the following discussion, the transistor 100 is considered to represent an N-channel enhancement type transistor in which the channel region 105 is P-doped and the drain and source regions 104, 103 and the corresponding extensions 104e, 103e are heavily N-doped. For a P-channel enhancement type transistor, the type of charge carriers involved and the conductivity type of the dopants may be inverted. Also, the following explanations in principle apply to depletion type transistors. Hence, upon application of a control voltage to the gate electrode 107 below a specific threshold voltage which is determined, among other things, by the vertical dopant profile within the channel region 105, the transistor 100 is in the off-state, that is the PN junction 104p is inversely biased and hence a current from the source region 103 through the channel region 105 to the drain region 104 is substantially suppressed. However, during the off-state the high electrical field prevailing at the overlap 104o may lead to tunnel currents into the gate electrode 107, especially when the gate insulation layer 109 is moderately thin, as is the case in sophisticated transistor devices. These currents may be considered as static leakage currents. Moreover, the overlap region 104o in combination with the overlying gate electrode 107 and the gate insulation layer 109 forms a capacitor, which has to be charged and discharged when operating the transistor 100 in a switched mode.

During application of a control voltage exceeding the threshold voltage, a conductive channel is formed in the channel region 105 originating from the source-side extension region 103e and terminating at the drain-side extension region 104e. For the building up of the conductive channel, in the present case created by electrons, the overlap region 103o as well as the relatively steep concentration gradient of the PN junction 103p, created by the increased dopant concentration of the halo region 111, is advantageous in obtaining a high on-current. Contrary thereto, the steep concentration gradient at the PN junction 104p may lead to enhanced currents into the substrate 101, that is, in lower lying crystalline areas of the region 102, which may finally be drained off by a corresponding body contact, so that the dynamic leakage currents may also increase with an increase of the on-current. Moreover, during the building up of the conductive channel, the parasitic capacitances caused by the overlaps 104o, 103o may require high currents for recharging the parasitic capacitor and may delay the start of the on-state, thereby degrading the raise and fall times during the switching operation.

As can be seen from the above discussion, in addition to the overall geometric configuration of the transistor 100, such as transistor length and width, as well as material compositions, dopant concentrations and the like, also the lateral and vertical dopant profiling within the semiconductor region 102 significantly affects the finally obtained transistor performance. Due to the ongoing scaling of transistor elements, resulting in continuously increased operating speeds, a corresponding design of the drain and source architecture is important so as to not unduly offset any performance advantages gained by reducing the feature sizes owing to the increased static and dynamic losses and parasitic capacitances.

In view of the above situation, there exists a need for an improved technique that enables improved drain and source designs to obtain an increased overall performance of highly scaled transistor devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the enhancement of transistor performance by performing the halo implantation and the extension implantation in an asymmetric manner with respect to a drain and source region to provide enhanced current drive capabilities while reducing static and dynamic leakage currents as well as parasitic capacitances. For example, in some embodiments, the dopant profile at the source side is created, for instance by tilted implantations, such that the formation of a conductive channel is enhanced, thereby improving the drive current capability of the transistor. Simultaneously, the dopant profile at the drain side may be adjusted to obtain a reduced overlap and thus parasitic capacitance and/or reduced dynamic leakage currents. This can be achieved by an asymmetric design of the halo region and the extension regions.

According to one illustrative embodiment of the present invention, a method comprises implanting a first ion species into a semiconductor region having formed thereon a gate electrode structure including a source-side portion and a drain-side portion. The first ion species thereby forms a first implantation region having a first overlap with the gate electrode structure at the source-side portion, wherein the overlap is asymmetric with respect to the gate electrode structure along a gate length direction. Furthermore, a second ion species is implanted into the semiconductor region and into the first implantation region to form a second implantation region that is asymmetric with respect to the gate electrode structure along the gate length direction.

According to another illustrative embodiment of the present invention, a transistor device comprises a gate electrode structure formed above a crystalline semiconductor region and a channel region formed adjacent to a gate insulation layer that separates the gate electrode structure from the crystalline semiconductor region. Moreover, the device comprises a drain region and a source region formed adjacent to the gate electrode structure, wherein the drain region defines a first PN junction and the source region defines a second PN junction with the channel region. The second PN junction has a steeper dopant concentration gradient than the first PN junction and defines a source overlap area with the gate electrode structure that is greater than a drain overlap area defined by the first PN junction.

According to yet another illustrative embodiment of the present invention, a semiconductor device comprises a first transistor having an asymmetric design with respect to an overlap between a gate electrode structure and source and drain regions. Moreover, the transistor has a higher dopant concentration gradient at a source PN junction than at a drain PN junction. The device further comprises a second transistor having an asymmetric design with respect to an overlap between a gate electrode structure and source and drain regions. The second transistor also has a higher dopant concentration gradient at a source PN junction than at a drain PN junction, wherein the first and second transistors differ from each other in at least one of type of transistor, orientation with respect to a substrate, dopant concentration gradient of the source PN junction, dopant concentration gradient of the drain PN junction and degree of asymmetry.

BRIEF DESCRIPTION OF THE DRAWINGS

The invention may be understood by reference to the following description taken in conjunction with the accompanying drawings, in which like reference numerals identify like elements, and in which.

Figure 1:
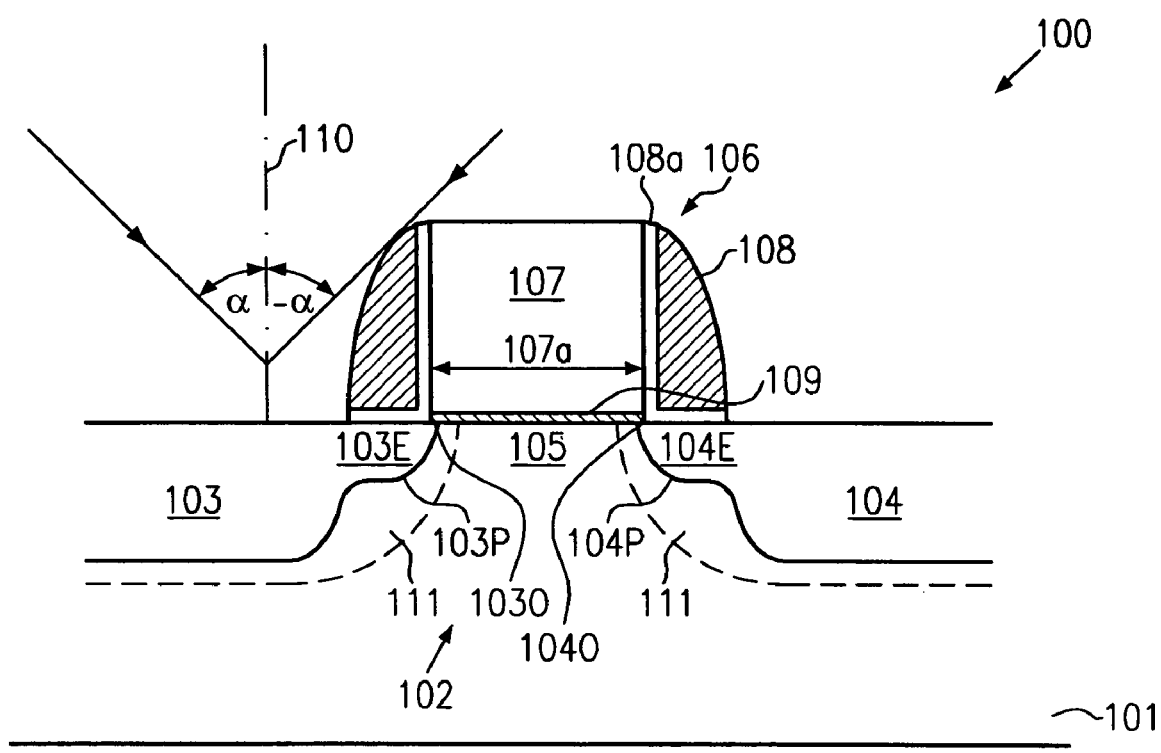
FIG. 1 schematically shows a cross-sectional view of a typical conventional architecture of a field effect transistor with symmetrically formed halo and drain and source regions.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that the transistor performance may be enhanced by correspondingly designing the halo region and the source extension to provide an enhanced current drive capability, while the drain extension may be specifically designed to reduce the overlap capacitance. Moreover, the concentration gradient at the PN junctions are adapted to reduce dynamic leakage currents. To this end, the concentration gradient at the drain-side PN junction may be formed and engineered to be less as compared to the source-side PN junction by correspondingly reducing the halo dopant concentration at the drain side or even substantially completely avoiding a halo implantation region at the drain side. Consequently, by correspondingly modifying implantation cycles on the basis of a basic transistor design for a given technology node, the transistor performance may significantly be enhanced while still maintaining a high degree of compatibility with the conventional process flow for this specific technology node. With reference to FIGS. 2a–2d and 3a–3d, further illustrative embodiments of the present invention will now be described in more detail.

Figure 2A:
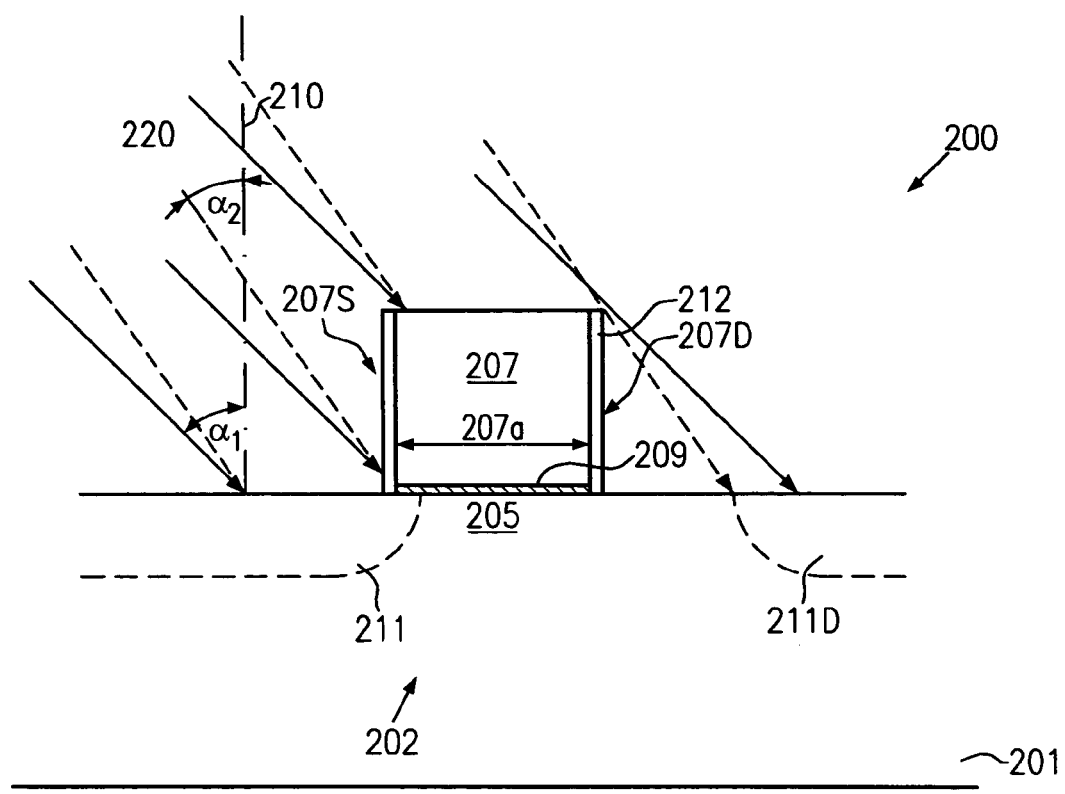
FIGS. 2a–2d schematically show cross-sectional views of a transistor element having an asymmetric design of the halo region and the drain and source region in accordance with illustrative embodiments of the present invention.

FIG. 2a schematically shows a cross-sectional view of a transistor element 200 during an initial manufacturing stage. The transistor element 200 comprises a substrate 201, which may represent a bulk semiconductor substrate, an insulating substrate having formed thereon a crystalline semiconductor layer and the like. For instance, the substrate 201 may represent a bulk silicon substrate having formed thereon, for example as an upper portion thereof, a crystalline semiconductor region 202 which may be comprised of silicon, silicon/germanium and the like. The substrate 201 may also be provided as a silicon-on-insulator (SOI) substrate wherein the semiconductor region 202 may represent a silicon layer that may have included therein, except for any dopants, other materials such as germanium, carbon and the like. It should be appreciated that the present invention may readily be applied to any appropriate semiconductor material, such as gallium arsenide, germanium or any other III-V or II-VI semiconductor materials, although the vast majority of logic circuitry is presently manufactured on the basis of silicon. It should also be appreciated that the term "MOS" or "CMOS" is to be understood as including any technology using field effect transistors, irrespective of the specific transistor design. A gate electrode 207 having a gate length 207a, which may be formed of any appropriate material, such as polysilicon in silicon based devices, is formed above the semiconductor region 202 and is separated therefrom by a gate insulation layer 209. As previously explained, the material composition of the gate insulation layer 209 is not necessarily restricted to oxides but may include any insulating material that exhibits the desired insulation characteristics in combination with process compatibility and permittivity characteristics. For example, the gate insulation layer 209 may be comprised of nitrogen enriched silicon dioxide, silicon dioxide, silicon nitride or any other high-k dielectric materials, possibly in combination with one or more of the preceding materials. The dimensions of the gate electrode 207, for example the gate length 207a, and the thickness of the gate insulation layer 209 may be selected in conformity with design requirements and are substantially determined by the design rules of a specified technology node. For example, in advanced transistor elements, the gate length 207a may be on the order of 50 nm and even less with a thickness of the gate insulation layer 209 in the range of 1.5–2.0 nm when the material composition is based on silicon dioxide. It should be appreciated, however, that the principles and the teachings provided herein are independent from specific device dimensions and thus the present invention may also advantageously be practiced in conjunction with less advanced transistor devices.

A channel region 205 is defined in the semiconductor region 202, wherein the position of the channel region 205 is determined by the location of the gate electrode 207. Moreover, a halo region 211 is formed in the semiconductor region 202 in the vicinity of a source-side portion 207s of the gate electrode 207, while the semiconductor region 202 substantially lacks a halo region in the vicinity of a drain-side portion 207d. Instead, an implantation region 211 d may be formed spaced apart from the drain-side portion 207d. It should be noted that the halo region 211 is defined by an increased dopant concentration compared to the dopant concentration in the channel region 205, as is also explained with reference to the halo regions 111 in FIG. 1.

A typical process flow for forming the transistor element 200 as shown in FIG. 2a may comprise substantially the same process steps with respect to the gate electrode 207 and the gate insulation layer 209 as are previously described with reference to the transistor 100 in FIG. 1. Thus, after the formation of the gate electrode 207, offset spacers 212 may be formed on the basis of well established spacer techniques including, for instance, the conformal deposition of a specific material such as silicon dioxide or silicon nitride and a subsequent anisotropic etch process. It should be noted that the dimensions of the offset spacer 212 may be selected to obtain a desired masking effect during a subsequent implantation for forming source and drain extensions, as will be described later with reference to FIG. 2b.

In the embodiment shown in FIG. 2a, the transistor element 200 is subjected to an ion implantation process 220, wherein the offset spacers 212 may be formed prior to the ion implantation 220, whereas, in other embodiments, the offset spacers 212 may be formed after the implantation process 220. During the implantation 220, a substantially parallel ion beam is directed to the semiconductor region 202 with a non-zero tilt angle with respect to a direction 210 that is perpendicular to the surface of the substrate 201. In some embodiments, the tilt angle may be selected to locate the specified ion species well below the gate electrode 207 at the source-side portion 207s, thereby forming the halo region 211, while the gate electrode 207 masks the area in the vicinity of the drain-side portion 207d, thereby forming the implantation region 211d. In FIG. 2a, one tilt angle, indicated as α1, is selected sufficiently high to obtain a moderate high overlap of the halo region 211 with the gate electrode 207. In some embodiments, the halo implantation 220 with a single tilt angle may be considered sufficient for forming the halo region 211. Hereby, the implantation parameters such as dose and energy may correspondingly be adapted to obtain the desired shape for the halo region 211.

In other embodiments, varying the tilt angle and/or the implantation dose and/or the implantation energy may be performed in the implantation 220. For example, in a first step, the tilt angle α1 may be used in combination with a correspondingly high dose and low implantation energy to provide a shallow dopant profile, which creates a desired overlap with the gate electrode 207. Then a second implantation step using a smaller tilt angle α2 may be performed with correspondingly adapted implantation parameters, that is, a reduced dose and an increased implantation energy, to provide the desired depth of the halo region 211. In other embodiments, a plurality of different implantation steps may be performed or the tilt angle may be varied continuously, wherein the time period for which the device 200 is exposed to the ion beam for a specific tilt angle may be varied. Furthermore, the dose and/or energy may be varied in a time-dependent manner in order to obtain a desired complex dopant profile in the lateral and vertical direction for the halo region 211. As is well known, the penetration depth of a specified ion species depends on the implantation energy, the type of material with which the penetrating ions interact and, for a crystalline target material, to a certain degree on the tilt angle with respect to major crystalline axes and planes owing to channeling effects. Ion channeling may occur when the incoming ion beam is substantially aligned to a major axis or plane of the crystal lattice so that the average potential of the crystallographic axis or plane provides a significantly increased penetration depth compared to a substantially amorphous material of the same type. Therefore, in some embodiments, a pre-amorphization implantation may be carried out prior to any halo or extension implantations, as will also be described with reference to FIG. 3a. In other embodiments, the moderately high tilt angle α1 or α2 during the halo implantation 220 may be considered acceptable to substantially reduce any channeling effects, since the ion beam of the implantation 220 substantially "sees" high-index crystallographic orientations so that the response of the crystalline region 202 to the penetrating ions is similar to a material of low spatial order.

It is to be noted that the implantation parameters for the implantation 220 may readily be obtained by carrying out corresponding simulations, for which appropriate computer programs are readily available. For example, based on the simulation results, corresponding test parameters may be established and may be used as a basis for test and production processes. The parameters may then be finely tuned by corresponding test results or by monitoring measurement data of, for instance, electrical test runs of completed transistor devices.

Figure 2B:
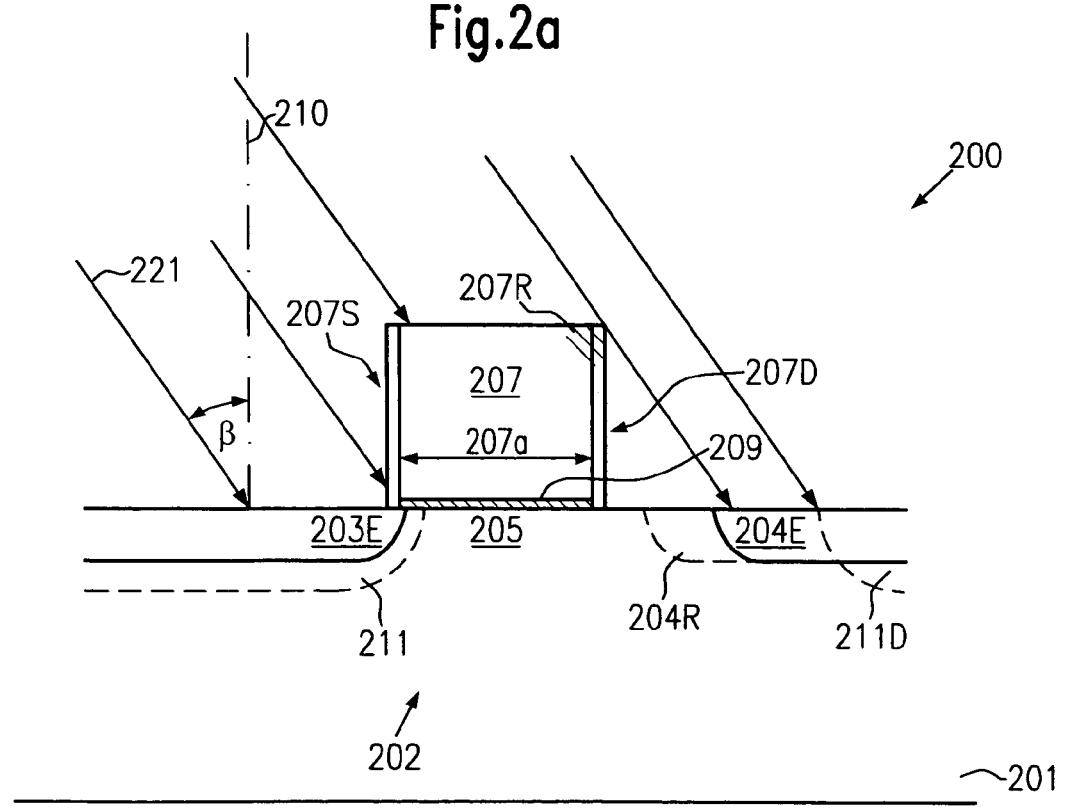

FIG. 2b schematically shows the transistor element 200 during a further ion implantation 221 for forming an extension region 203e in the vicinity of the source-side portion 207s and a drain extension region 204e in the vicinity of the drain-side portion 207d. As shown in FIG. 2b, the implantation 221 may be performed by employing, at least during a specified time period, a tilt angle β to deposit a second ion species of a required conductivity type more closely to the gate electrode 207 or to provide even a desired amount of overlap at the source-side portion 207s, while substantially avoiding the formation of any overlap at the drain-side portion 207d. In some embodiments, the tilt angle β may be varied, either continuously or step-wise, with a corresponding adaptation of implantation energy and dose to create a desired complex lateral and vertical concentration profile for the extension region 203e and 204e. For instance, the implantation 221 may include an implantation period with a tilt angle of zero or even a negative value, if a certain degree of overlap at the drain-side portion 207d is desired. Preferably, the implantation 221 is performed to create an asymmetric extension design in which the extension region 203e is located more closely to the gate electrode 207, or such that an overlap is achieved that is significantly greater than any overlap created at the drain-side portion 207d. In one particular embodiment, substantially no overlap is created for the extension region 204e during the implantation 221. Moreover, in particular embodiments, the averaged tilt angle β of the implantation 221 is greater than the averaged tilt angle α of the implantation 220 so that the extension region 204e may not be "over compensated" by the inversely doped region 211d. Moreover, the tilt angle β may be selected to create an area 204r of reduced dopant concentration at the extension region 204e due to a certain masking effect of an upper portion 207r of the gate electrode 207. Consequently, the implantation dose may be selected sufficiently high to achieve the required high dopant concentration in the extension region 203e, thereby over-compensating the concentration of the halo region 211 as required while still providing for a merely moderately high dopant concentration in the region 204r.

In other embodiments, when two or more implantation steps are performed during the implantation 221, the preponderant amount of the ion species may be introduced under an appropriate tilt angle β, while the tilt angle and the dose may then be reduced to create the region 204r of moderately high dopant concentration, wherein the distance of the region 204r to the gate electrode 207 may be adjusted by the selection of the reduced tilt angle. For instance, if the offset spacer 212 is provided with respect to a minimum distance of the region 204r from the gate electrode 207, the tilt angle β may be reduced to zero, after the formation of a desired asymmetric basic extension design, with a correspondingly reduced implantation dose to obtain the moderately high concentration in the region 204r, while still having the required high concentration in the region 203e. Regarding the implantation parameters for the implantation 221, the same criteria apply as previously explained with the implantation 220. It should also be appreciated that, in some embodiments, the implantation 221 may be performed prior to the implantation 220. Moreover, the order of implantations with different tilt angles may be varied in accordance with process requirements.

Figure 2C:
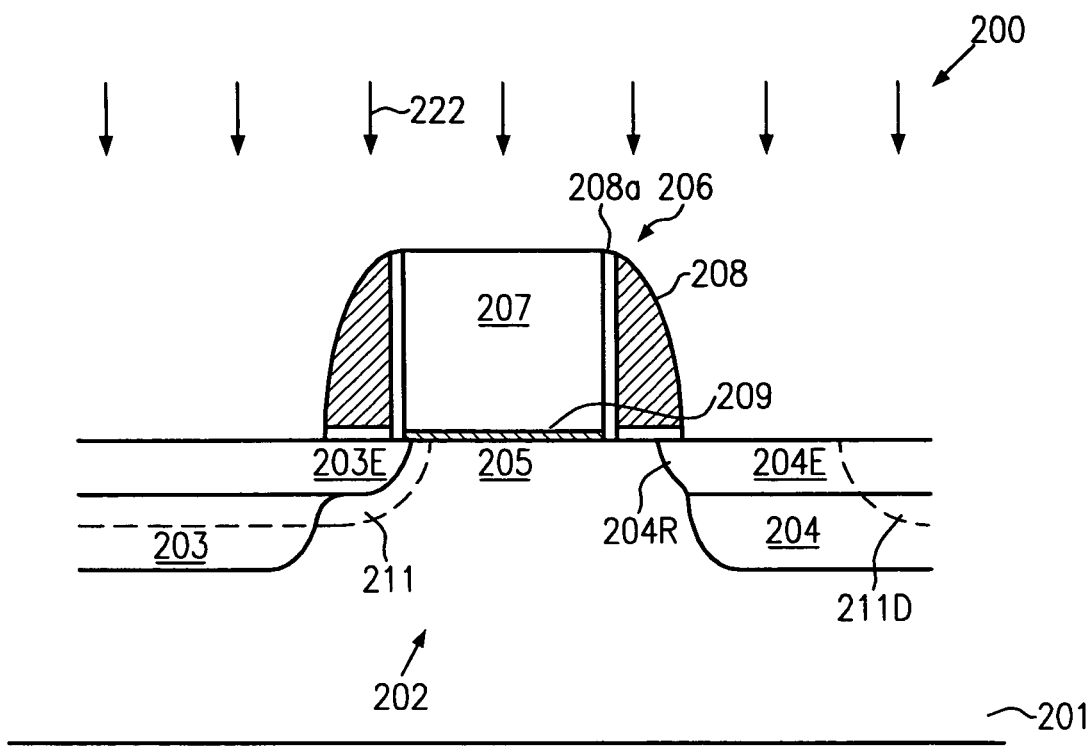

FIG. 2c schematically shows the transistor 200 in a further advanced manufacturing stage. Here, the transistor 200 comprises sidewall spacers 208, which may include a liner 208a and which are formed on sidewalls of the gate electrode 207. The gate electrode 207 in combination with the gate insulation layer 209 and any sidewall spacers 208 and liners 208a may be referred to as a gate electrode structure 206. It should be appreciated that the gate electrode structure 206 may represent any type of gate electrode including one or more spacer elements and liners as is required for the further profiling of the dopant concentration in the region 202 and/or for the formation of metal silicide regions in a self-adjusting manner and/or for forming epitaxially grown semiconductor regions at the drain-side portion 207d and the source-side portion 207s, when a transistor architecture with raised drain and source regions is considered. Moreover, the gate electrode structure 206 is to include any configuration in which one or more of the sidewall spacers are temporarily formed in the gate electrode structure 206 and are removed at a later manufacturing state. The transistor element 200 is subjected to a further ion implantation process 222 to form the deep drain region 204 and the deep source region 203, while the sidewall spacers 208 in combination with the gate electrode 207 act as an implantation mask. As a consequence of the ion implantation 222, the extension region 203e is substantially maintained below the sidewall spacer 208 and a portion of the region 204r is substantially preserved below the sidewall spacer 208 at the drain-side portion 207d. Thus, the extension region 203e exhibits a desired dopant concentration to define a desired steep concentration gradient in conjunction with the halo region 211, while the region 204r at the drain-side exhibits a moderately steep gradient due to the substantial lack of the halo implant and the reduced dopant concentration implanted during the extension implantation 221.

The manufacturing process for the device 200 as shown in FIG. 2c may comprise substantially the same processes as are previously described with reference to FIG. 1, wherein the formation process for the sidewall spacers 208 may depend, as discussed above, on the specific transistor architecture.

Figure 2D:
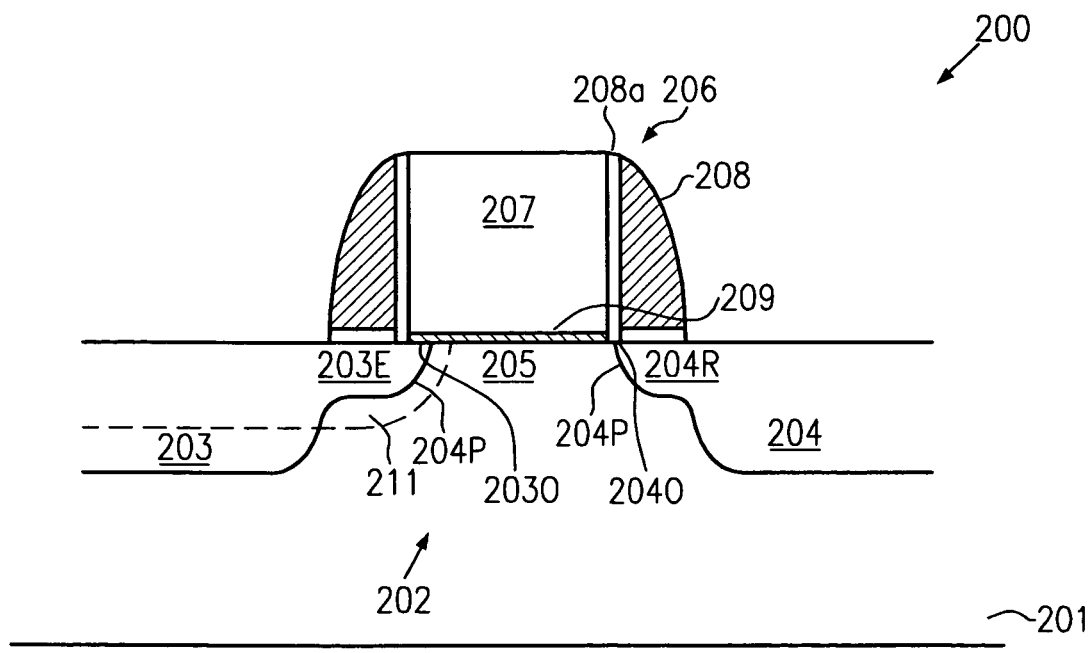

FIG. 2d schematically shows the transistor element 200 in a further advanced manufacturing stage. In FIG. 2d, the finally obtained dopant profile, except for minor changes due to thermally induced diffusion in subsequent manufacturing processes, is shown after the device shown in FIG. 2c has been subjected to an anneal process to activate the dopants and also cure, at least partially, implantation-induced lattice damage. During the anneal cycle, a specified amount of diffusion also takes place, which then determines the position of the PN junctions 203p and 204p with respect to the gate electrode 207. Hereby, the dopant concentration gradient, that is the transition from a specific dopant concentration of one conductivity type to a dopant concentration of an opposite conductivity type, is high at the PN junction 203p due to a moderately high concentration in the extension region 203e of the first conductivity type and the moderately high concentration in the halo region 211 of the opposite conductivity type. Moreover, the PN junction 203p defines an overlap area 203o at the source-side portion 207s, which is significantly greater than any overlap defined by the PN junction 204p. It should be noted that in particular embodiments no overlap at all or even a certain distance is defined between the PN junction 204p and the gate electrode 207. Seen from another point of view, the overlap regions 203o and 204o may be defined with respect to the electrode structure 206, thereby defining an asymmetric design, wherein it should be taken into consideration that the spatial relation of the respective PN junctions to the gate electrode 207 is actually the characteristic that essentially affects the transistor performance when it is referred to as an overlap. Moreover, the concentration gradient at the PN junction 204p is significantly less steep compared to the PN junction 203p due to the lack of the halo region and/or due to a reduced dopant concentration in the region 204r.

As a result, a transistor design is provided having an asymmetric design with respect to the position of the PN junctions of the drain and source 204, 203 with respect to the gate electrode 207, and which also has an asymmetric configuration with respect to the concentration gradient at the respective PN junctions. In particular, the overlap area 203o at the source-side portion 207s provides, in combination with a steep concentration gradient, an enhanced drive current capability, while the absence or reduced size of an overlap at the drain-side portion 207d provides a reduced parasitic capacitance, thereby improving the switching characteristics and also reduced static leakage currents. In addition, the moderately steep concentration gradient at the PN junction 204p may significantly reduce the dynamic leakage currents. As is evident from the above discussion, the relevant parameters substantially determining the transistor performance, such as the size of the overlap area 203o, the value of the dopant gradients at the PN junctions 203p and 204p, as well as the overall dopant concentration in the extension regions 203e and 204r, may be controlled by the process parameters of the implantations 220 and 221, in addition to other aspects, such as appropriately selecting the dimensions of any spacers such as the offset spacer 212 and the sidewall spacer 208. Consequently, on the basis of well established process techniques, the transistor performance for a given basic transistor architecture may significantly be enhanced while not unduly contributing to process complexity compared to a standard process flow, as is described for instance with reference to FIG. 1.

With reference to FIGS. 3a–3d, further illustrative embodiments of the present invention will now be described in which two or more transistor devices are not aligned to each other and/or two or more different types of transistor elements may receive differently designed drain and source regions.

Figure 3A:
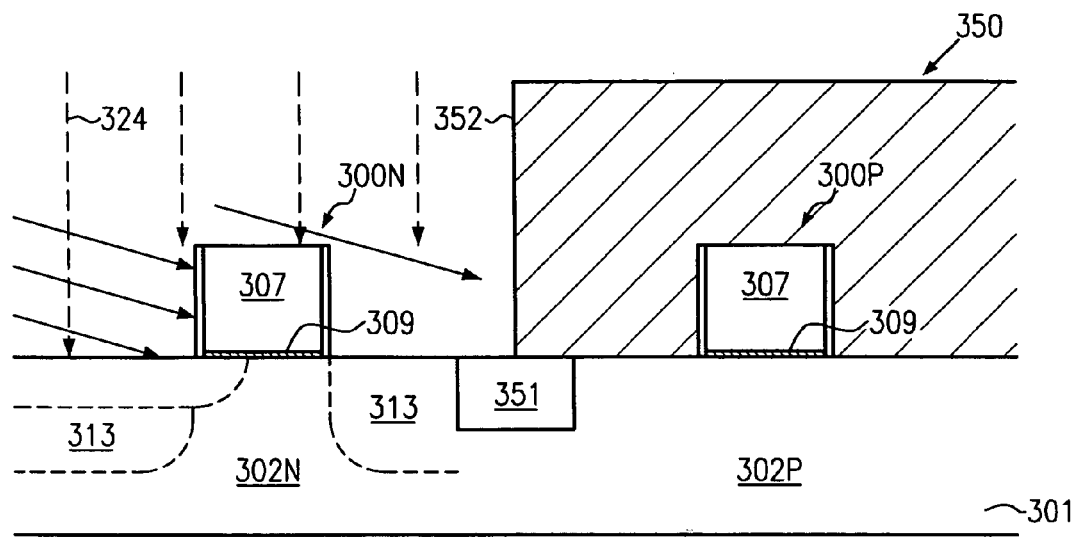
FIGS. 3a–3d schematically show cross-sectional views of a semiconductor device during various manufacturing stages for forming a plurality of transistor elements with asymmetric halo and drain and source design.

In FIG. 3a, a semiconductor device 350 comprises a first transistor element 300n and a second transistor element 300p at an early manufacturing stage. The transistor elements 300n and 300p may represent differently oriented devices and/or different types of transistors and/or transistors at different locations on the same die, which are spaced far away from each other, or the transistors may even represent devices on different dies of a substrate 301. In the embodiment shown, the transistor 300n may represent an N-channel transistor and the transistor 300p may represent a P-channel transistor, which may in combination define a complementary transistor pair. Thus, an isolation structure 351 may separate the two transistor elements. Moreover, a resist mask 352 is formed to cover the transistor 300p and expose the transistor 300n. The device 350 may be subjected to an ion bombardment 324 to form substantially amorphized regions 313 in a semiconductor region 302 of the transistor 300n, while a respective region 302 of the transistor 300p is substantially not affected by the ion bombardment 324. During the implantation 324, a gate electrode 307 formed on a gate insulation layer 309 of the transistor 300n may act in combination with any offset spacers 312 as an implantation mask, while the corresponding gate electrode 307, the gate insulation layer 309 and the offset spacers 312 of the transistor 300p may be protected by the resist mask 352. In some embodiments, the implantation 324 may be performed with a tilt angle to create a specific lateral profile of the substantially amorphized region 313 below the gate electrode 307 of the transistor 300n. In other embodiments, the implantation 324 may be performed substantially without a tilt angle to produce an amorphized region as is shown, for instance, at the right-hand side of the transistor 300n. If an asymmetric shape of the substantially amorphized region 313 is not required, or if the second transistor 300p may receive the same type of asymmetric configuration for a substantially amorphized region, the resist mask 352 may be omitted and the implantation 324 may be performed in the same way for the transistors 300n and 300p.

As previously explained, in subsequent halo implantations and extension implantations, moderately high tilt angles may be used so that, for a corresponding implantation, the channeling effect may sufficiently be suppressed. Consequently, in some embodiments, the mask 352 may be omitted and a substantially non-tilted implantation during the ion bombardment 324 may suffice to create the substantially amorphized region 313 as shown on the right-hand side of the transistor 300n in both the transistor 300p and 300n. Thus, in this case, the implantation 324 may be carried out for both transistor elements 300n, 300p simultaneously.

Regarding the manufacturing process involved in forming the device 350 as shown in FIG. 3a, the same processes may be used as previously described with reference to FIGS. 1 and 2a–2d. Moreover, the isolation structure 351 may be formed in accordance with well established shallow trench isolation techniques and the resist mask 352 may be formed in accordance with a photolithography technique as is already established for forming conventionally designed transistor elements of complementary transistor pairs.

Figure 3B:
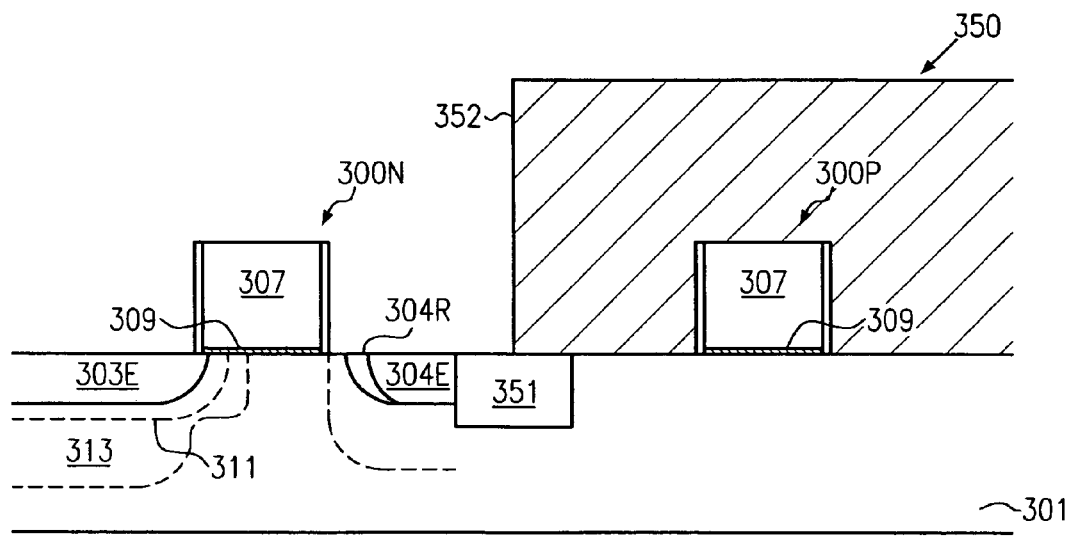

FIG. 3b schematically shows the device 350 after the completion of a further implantation sequence including a tilted halo implantation and a tilted extension implantation, similarly as described with reference to FIGS. 2a and 2b. Thereby, the same resist mask 352 may protect the second transistor 300p or, if the implantation 324 is performed for both transistors simultaneously, the resist mask 352 may be formed prior to the halo implantation and the extension implantation. Thus, an extension region 303e is formed at a source side and an extension region 304e including a region 304r of reduced dopant concentration is formed on a drain side of the transistor 300n. Moreover, a halo region 311 is formed at the source side. Regarding the specifics of the regions 311, 303e, 304e and 304r, the same criteria apply as previously explained with reference to FIG. 2e. Thereafter, the resist mask 352 may be removed.

Figure 3C:
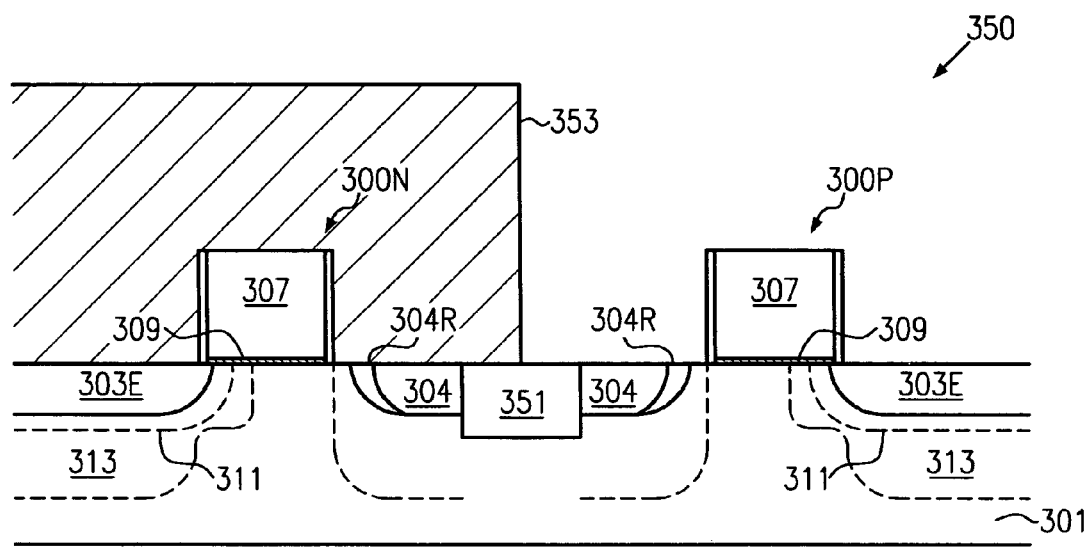

FIG. 3c schematically shows the device 350 after forming a second resist mask 353 covering the transistor 300n and exposing the transistor 300p. Moreover, an implantation sequence may have been performed in a similar way as is described with reference to the transistor 300n, wherein, in some embodiments, as shown, the orientation of the respective tilt angle may be changed, when the resist mask 353 has a height that may result in an undue ion capture when irradiating the transistor 300p from the left side as is shown for the transistor 300n. In other embodiments, however, the height of the resist mask 353 and the corresponding tilt angles may be compatible so that the same type of asymmetry may be created for the transistor 300p. Thus, after completion of the implantation sequence, the transistor 300p may also have the substantially amorphized region 313, the extension regions 303e, 304e, 304r and the halo region 311.

Thereafter, the resist mask 353 may be removed and the further processing may be continued by forming one or more appropriate spacer elements at sidewalls of the gate electrodes 307 of the first and second transistors 300n and 300p. Thereafter, corresponding resist masks such as the masks 352 and 353 may be formed and corresponding implantation processes may be carried out to form deep drain and source regions, as is also described with reference to FIG. 2c.

Figure 3D:
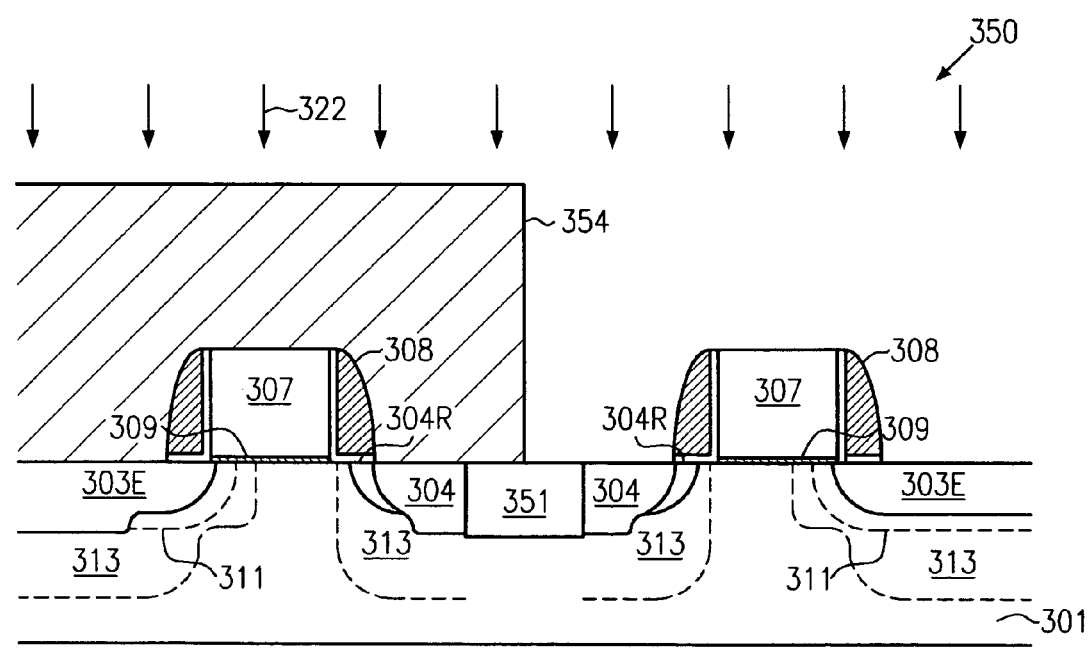

FIG. 3d schematically shows the device 350 during a final implantation 322 with a resist mask 354 covering the first transistor element 300n, which has previously already been subjected to an ion implantation for forming deep drain and source regions 303 and 304. Similarly, deep drain and source regions 303 and 304 are formed by the implantation 322 in the second transistor element 300p. Thereafter, the resist mask 354 may be removed and appropriately designed anneal cycles may be performed to activate the dopants and cure lattice damage to obtain the final lateral and vertical dopant profile for the first and second transistor elements 300n and 300p. As is evident from the above discussion, the asymmetric design of the first and second transistors 300n and 300p may be adjusted in a different manner for each of the transistors to enhance the transistor performance individually for each transistor. To this end, the corresponding implantation parameters may be individually adapted for each of the first and second transistors 300n, 300p. For example, the size of any overlap at the sources of the first and second transistors 300n, 300p as well as the respective concentration gradients may be adjusted differently. The same holds true for the position of the PN junction at the drain sides of the transistors and their corresponding concentration gradient. In some embodiments, the implantation processes for forming the respective extension regions 303e, 304e and the halo regions 311 may be performed as a single step implantation with an appropriate tilt angle, thereby obtaining a high degree of compatibility with the conventional process flow while still significantly increasing the performance of the individual transistors. In other embodiments, the implantation cycles may be configured to optimize vertical and lateral dopant profiles as is also explained with reference to FIGS. 2a and 2b. That is, the tilt angle and/or the doses and/or the energy may be varied in a time-dependent manner. It should also be appreciated that the transistors 300n and 300p may represent differently oriented transistors, i.e., the gate electrodes 307 may define an angle, such as 90 degrees, with each other wherein the transistors 300n and 300p may represent transistors of the same or different type. Consequently, the asymmetric design in accordance with the present invention may be accomplished for each of the transistors by correspondingly covering the respective die or substrate portions. Hence, any performance non-uniformities that may be detected by measuring one or more preceding substrates may, at least partially, be compensated for by providing a correspondingly designed resist mask to differently adjust the device performance for different substrate locations.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

implanting a first ion species into a semiconductor region having formed thereon a gate electrode structure having a source-side portion and a drain-side portion, said first ion species forming a first halo implantation region having a first overlap at said source-side portion, said overlap being asymmetric with respect to said gate electrode structure along a gate length direction wherein implanting said first ion species comprises a first implantation step with a first implantation energy, a first dose and a first non-zero tilt angle with respect to a direction perpendicular to a surface of said substrate, and a second implantation step with a second implantation energy, a second dose and a second non-zero tilt angle with respect to a direction perpendicular to a surface of said substrate, said first implantation energy being less than said second implantation energy, said first dose being higher than said second dose, and said first and second non-zero tilt angles being directed at said source-side portion and away from said drain-side portion; and implanting a second ion species into said semiconductor region and into said first implantation region to form a second implantation region that is asymmetric with respect to said gate electrode structure along the gate length direction, wherein said first and second ion species are of opposite conductivity type.

2. The method of claim 1, further comprising forming sidewall spacers adjacent to said source-side portion and said drain-side portion and implanting ions of said second ion species to form deep source and drain regions.

3. The method of claim 2, further comprising implanting a third ion species prior to implanting said first and second species to substantially amorphize a region that at least corresponds to said deep source and drain regions.

4. The method of claim 3, wherein said substantially amorphized region includes said first and second implantation regions.

5. The method of claim 1, wherein said second ion species is implanted with a non-zero tilt angle with respect to a direction perpendicular to a surface of said substrate.

6. The method of claim 5, wherein an averaged first tilt angle used during implantation of said first ion species to form said first implantation region is greater than an averaged second tilt angle used during implantation of said second ion species to form said second implantation region.

7. The method of claim 5, wherein at least one of a dose, a tilt angle and an implantation energy is varied in a time-dependent manner during the implantation of said first ion species.

8. The method of claim 5, wherein at least one of a dose, a tilt angle and an implantation energy is varied in a time-dependent manner during the implantation of said second ion species during the formation of said second implantation region.

9. The method of claim 1, wherein said substrate comprises at least one second gate structure having a source-side portion and a drain-side portion that are aligned to said source-side portion and drain-side portion of said gate electrode structure.

10. The method of claim 9, further comprising forming a resist mask over said second gate electrode structure when forming said first and second implantation regions adjacent to said gate electrode structure.

11. The method of claim 10, further comprising removing said resist mask and forming a second resist mask covering said gate electrode structure and a surface area adjacent to said gate electrode structure while exposing said second gate electrode structure and a surface area adjacent to said second gate electrode structure and implanting ions of said second species into the surface area adjacent to the second gate electrode structure.

12. The method of claim 1, wherein said substrate comprises at least one second gate structure having a source-side portion and a drain-side portion, said second gate electrode structure having an orientation other than said gate electrode structure.

13. The method of claim 12, further comprising forming a resist mask over said second gate electrode structure when forming said first and second implantation regions adjacent to said gate electrode structure.

14. The method of claim 13, further comprising removing said resist mask and forming a second resist mask covering said gate electrode structure and a surface area adjacent to said gate electrode structure while exposing said second gate electrode structure and a surface area adjacent to said second gate electrode structure and implanting ions of said second species into the surface area adjacent to the second gate electrode structure.

15. The method of claim 1, further comprising forming a first pn-junction at a drain region and a second pn-junction at a source region of said gate electrode structure, wherein said second pn-junction defines a source overlap area with said gate electrode structure that is greater than a drain overlap area defined by said first pn-junction.

16. The method of claim 15, wherein said second pn-junction has a higher dopant concentration gradient than said first pn-junction and defines a source overlap area with said gate electrode structure that is greater than a drain overlap area defined by said first pn-junction.

17. A method, comprising:
implanting a first ion species into a semiconductor region having formed thereon a gate electrode structure having a source-side portion and a drain-side portion, said first ion species forming a first halo implantation region having a first overlap at said source-side portion, said overlap being asymmetric with respect to said gate electrode structure along a gate length direction;
implanting a second ion species into said semiconductor region and into said first implantation region to form a second implantation region that is asymmetric with respect to said gate electrode structure along the gate length direction, wherein said first and second ion species are of opposite conductivity type; and
forming a first pn-junction at a drain region and a second pn-junction at a source region of said gate electrode structure, wherein said second pn-junction has a higher dopant concentration gradient than said first pn-junction.

18. The method of claim 17, wherein said second pn-junction has a defines a source overlap area with said gate electrode structure that is greater than a drain overlap area defined by said first pn-junction.

19. The method of claim 17, wherein implanting said first ion species comprises a first implantation step with a first implantation energy, a first dose and a first non-zero tilt angle with respect to a direction perpendicular to a surface of said substrate, and a second implantation step with a second implantation energy, a second dose and a second non-zero tilt angle with respect to a direction perpendicular to a surface of said substrate, said first implantation energy being less than said second implantation energy, said first dose being higher than said second dose, and said first and second non-zero tilt angles being directed at said source-side portion and away from said drain-side portion.

* * * * *